United States Patent
Seino et al.

(10) Patent No.: US 8,085,110 B2
(45) Date of Patent: Dec. 27, 2011

(54) MICROWAVE DEVICE, HIGH-FREQUENCY DEVICE, AND HIGH-FREQUENCY EQUIPMENT

(75) Inventors: Kiyoharu Seino, Tokyo (JP); Masahiko Hunada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 267 days.

(21) Appl. No.: 12/523,899

(22) PCT Filed: Jan. 30, 2008

(86) PCT No.: PCT/JP2008/051352
§ 371 (c)(1),
(2), (4) Date: Jul. 21, 2009

(87) PCT Pub. No.: WO2008/093697
PCT Pub. Date: Aug. 7, 2008

(65) Prior Publication Data
US 2010/0019870 A1   Jan. 28, 2010

(30) Foreign Application Priority Data

Jan. 31, 2007   (JP) ................. 2007-021339
Mar. 8, 2007    (JP) ................. 2007-058660

(51) Int. Cl.
*H01P 3/02* (2006.01)
*H03H 7/38* (2006.01)
(52) U.S. Cl. ...................... 333/24 C; 333/33
(58) Field of Classification Search ............. 333/24 C, 333/32, 33; 330/277, 286
See application file for complete search history.

(56) References Cited

U.S. PATENT DOCUMENTS

| | | | | |
|---|---|---|---|---|
| 4,504,796 A * | 3/1985 | Igarashi | | 330/286 |
| 4,518,931 A * | 5/1985 | Rauscher | | 331/76 |
| 4,623,848 A * | 11/1986 | Saka et al. | | 330/286 |
| 4,754,229 A * | 6/1988 | Kawakami et al. | | 330/277 |
| 4,771,247 A * | 9/1988 | Jacomb-Hood | | 330/277 |
| 5,093,640 A | 3/1992 | Bischof | | |
| 5,920,808 A * | 7/1999 | Jones et al. | | 455/127.1 |
| 6,034,580 A | 3/2000 | Henderson et al. | | |
| 6,338,546 B1 * | 1/2002 | Kotaki et al. | | 333/218 |
| 6,980,057 B2 * | 12/2005 | Morimoto et al. | | 330/286 |
| 7,236,053 B2 * | 6/2007 | Pribble et al. | | 330/251 |
| 2002/0105395 A1 | 8/2002 | Tajima | | |
| 2005/0225408 A1 | 10/2005 | Yagisawa et al. | | |

FOREIGN PATENT DOCUMENTS

| | | |
|---|---|---|
| EP | 1 241 730 A2 | 9/2002 |
| EP | 1 241 730 A3 | 9/2002 |
| EP | 1 585 184 A1 | 10/2005 |
| JP | 60-176301 | 9/1985 |

(Continued)

*Primary Examiner* — Dean O Takaoka
(74) *Attorney, Agent, or Firm* — Oblon, Spivak, McClelland, Maier & Neustadt, L.L.P.

(57) ABSTRACT

Since the loss of the conventional microwave device is large, when this device is applied to the microwave component, there are problems; for example, a low-noise amplifier, the noise figure is degraded, and when applied to a high-output amplifier, output and efficiency may be decreased. In particular, in the high-output amplifier of over 100 W class, heat generation at a capacitor which forms the microwave device increases, which causes a problem that the reliability of the microwave device may be decreased. A structure is formed to include a capacitor loaded between two high impedance lines the length of which has ¼ wavelength in the desired frequency band and the characteristic impedance is higher than 50Ω.

8 Claims, 10 Drawing Sheets

FOREIGN PATENT DOCUMENTS

| | | |
|---|---|---|
| JP | 60-214601 | 10/1985 |
| JP | 61-140602 | 8/1986 |
| JP | 2-164101 | 6/1990 |
| JP | 6-21705 | 1/1994 |
| JP | 6-45849 | 2/1994 |
| JP | 2005-303551 | 10/2005 |

* cited by examiner (a)

(b)

(a)

(b)

(c)

(a)

(b)

MICROWAVE DEVICE, HIGH-FREQUENCY DEVICE, AND HIGH-FREQUENCY EQUIPMENT

TECHNICAL FIELD

The present invention relates to a microwave device which is necessary to form a microwave component used for a radar equipment, a communication equipment, etc.

Further, the present invention relates to a high-frequency device for forming a high-frequency equipment of microwave or millimeterwave band used for a radar equipment, a communication equipment, etc.

BACKGROUND ART

A large number of microwave equipment components such as an amplifier, an oscillator, an attenuator, etc. are used for radar equipments and communication equipments. Usually, semiconductor elements such as a transistor, a field-effect transistor (FET, hereinafter), a diode, etc. are used for these microwave equipment components. A microwave device is employed in these semiconductor elements for supplying desired DC bias voltage and microwave signals.

Usually, the microwave device used for the microwave equipment components is loaded between the power source and the semiconductor elements, between the load and the semiconductor elements, or between the semiconductor elements themselves.

The microwave device having a structure in which a capacitor is loaded in series to a main line by which microwave signals are transmitted is used. This kind of microwave device has a function to block direct current and pass microwave, and it is generally known as a DC blocking capacitor (refer to Patent Document 1, for example).

Patent Document 1: JP06-045849

DISCLOSURE OF THE INVENTION

Problems to be Solved by the Invention

The conventional microwave device is structured to include a capacitor loaded on a main line provided on a dielectric board. A value of the capacitor is selected to be a value which suppresses the impedance sufficiently small in the desired frequency band, and a characteristic impedance of a main line is usually selected to be 50Ω.

Since the impedance of the capacitor is nearly infinite in direct current, this microwave device has a function to block direct current and pass microwave signals in the desired frequency band. When this microwave device is used for an input side of an amplifier, for example, it is possible to simultaneously supply a DC bias voltage which has been supplied through a bias circuit and microwave signals which has been supplied from the power source to a semiconductor element such as EFT, etc. which forms the amplifier.

Generally, microwave signals are attenuated by passing the microwave device. Attenuation L is dependent on a resistance component R of a capacitor and an impedance Z of a place where the capacitor is loaded, and is given by the following expression (1):

$$L = 2/(2+R/Z) \quad (1)$$

In order to reduce the attenuation of the microwave device, it is necessary to select a capacitor of which resistance component is small or to increase the impedance of the place where the capacitor is loaded. However, available capacitors are limited; among capacitors which are available in the market, the smallest resistance is about 1Ω. Further, in order to increase the impedance of the place where the capacitor is loaded, it is necessary to increase the characteristic impedance of the main line, which may affect the characteristics of the microwave component.

For example, on increasing the characteristic impedance of the main line, it is necessary to select the characteristic impedance of the main line to be around 50Ω in order not to affect the characteristics of the microwave component. Because of this, the impedance of the place where the capacitor is loaded also becomes also 50Ω.

In this case, if the resistance of the capacitor is 1Ω, and the impedance of the place where the capacitor is loaded is 50Ω, the attenuation of the microwave device is about 0.086 dB from the expression (1), which raises a problem that the loss of the microwave device becomes large.

For example, when this kind of microwave device is used for a low-noise amplifier, this value directly causes the degradation of the noise figure, which raises a problem that low-noise characteristics cannot be obtained. Further, when used for a high-output amplifier, this value causes a problem that the output may be decreased and also the efficiency may be degraded. In particular, a wideband gap device has been developed as a high-output semiconductor element, and a high-output amplifier of 100 W or more is being embodied. In such a case, the calorific power of the capacitor becomes about 2 W, which means thermally serious condition, and there is a problem that the reliability of the microwave device may be largely decreased.

The present invention is provided to solve the above problems, and aims to reduce the loss of the microwave device despite the existing capacitor is used.

Further, the present invention is provided to solve the above problems, and aims to reduce the insertion loss of a high-frequency device in the microwave or millimeterwave band.

Means to Solve the Problems

A microwave device according to the present invention includes: two high impedance lines a length of which has ¼ wavelength in a desired frequency band and a characteristic impedance is higher than 50Ω; and a capacitor loaded between one ends of the two high impedance lines.

Further, a microwave device of the invention includes: two L-shape circuits, each of which including a transmission line a length of which is sufficiently short such as equal to or less than about ⅛ wavelength in a desired frequency band and a characteristic impedance of which is higher than 50Ω, and an open-circuited stub a length of which is shorter than ¼ wavelength and connected to one end of the transmission line; and a capacitor loaded between one ends of the transmission lines to which the open-circuited stubs are connected.

Further, a high-frequency device of the invention includes: two main lines arranged so that one ends are contacted each other; high impedance lines provided at respective one ends of the main lines directed to the main lines that are respectively facing; and capacitors loaded respectively between tops of the high impedance lines and the main lines respectively facing.

Further, a high-frequency device of the invention includes: two main lines arranged so that one ends are contacted each other; capacitors loaded respectively at one ends of the main lines; and conductive lines connected respectively between the capacitors and the one ends of the main lines that are facing.

Further, a high-frequency equipment of the invention includes the above high-frequency device connected to a field-effect transistor of gallium nitride system.

Effect of the Invention

According to the microwave device of the present invention, by structuring two high impedance lines the length of which has ¼ wavelength in the desired frequency band and the characteristic impedance is higher than 50Ω and a capacitor loaded between one ends of the two high impedance lines, which has the effect that the microwave device can reduce the loss despite the existing capacitors are used.

Further, according to the microwave device of the present invention, by structuring with the transmission line of which the length is sufficiently short compared with the wavelength and of which characteristic impedance is higher than 50Ω, which has the effect that the microwave device can reduce the loss despite the existing capacitors are used.

Further, according to the high-frequency device of the present invention, by structuring with two capacitors which are equivalently loaded in parallel, it is possible to reduce the insertion loss of the capacitor.

Further, according to the high-frequency device of the present invention, by connecting the high-frequency device to the field-effect transistor and applying to the low-noise amplifier, it is possible to obtain the low-noise characteristics. Further, by applying the high-frequency device to the high-output amplifier, it is possible to further improve the output and the efficiency

PREFERRED EMBODIMENTS FOR CARRYING OUT THE INVENTION

Embodiment 1

The first embodiment of the present invention will be explained with reference to FIGS. 1 through 4.

FIG. 1 shows the first embodiment, and shows a structure when a microwave device for supplying desired DC bias voltage and microwave signals to a semiconductor element is applied to an input side of an amplifier composed of a FET, etc.

1 shows a dielectric board, 2 is an input terminal, 3 and 4 are main signal lines, respectively, 5 is a FET, 6 is a ¼ wavelength stub, 7 is a capacitor, 8 is a gold wire, 9 and 10 are high impedance signal lines, 11 is a capacitor, 12 is a gold wire, and 13 is a microwave device.

This amplifier includes the main lines 3 and 4, the microwave device 13 provided between the main lines 3 and 4, the ¼ wavelength stub 6, one end of which is connected to the main line 4, the input terminal 2 connected to one end of the main line 3, the FET 5 connected to one end of the main line 4, the capacitor 7 for grounding the top of the ¼ wavelength stub 6 by high frequency, and the gold wire 8; the main lines 3 and 4, the microwave device 13 and the ¼ wavelength stub 6 are formed as one unit on the dielectric board 1 using microwave integrated circuit technique. Here, although a metal film for grounding is coated on a back face of the dielectric board 1, and power source is connected to the input terminal 2 for generating microwave signals, they are omitted here.

Further, the microwave device 13 includes the high impedance lines 9 and 10 having the length of about ¼ wavelength, the capacitor 11 loaded between the high impedance lines 9 and 10, and the gold wire 12 connecting the capacitor 11 and one end of the high impedance line 10. A value of the capacitor 11 is selected to be a value which suppresses the impedance sufficiently small such as equal to or less than some Ω (equal to or less than 4Ω to 5Ω, for example) in the desired frequency band.

Like this, by applying the microwave device 13 of the embodiment of the present invention to the input side of the amplifier, DC bias voltage applied from neighborhood of the capacitor 7 is blocked by the capacitor 11, and is not supplied to the power source connected to the input terminal 2, but supplied to only a gate terminal of the FET 5 through the ¼ wavelength stub 6.

On the other hand, the impedance of the ¼ wavelength stub 6 which is short-circuited by high frequency with the capacitor 7 and the gold wire 8 extremely increases in the desired frequency band, so that the microwave signals generated by the power source is inputted to the gate terminal of the FET 5 through the input terminal 2, the main line 3, the microwave device 13, and the main line 4. Like this, by applying the microwave device 13 of the embodiment of the present invention to a microwave component such as the amplifier, it is possible to supply the desired DC bias voltage and the microwave signals to a semiconductor element such as the FET 5.

FIG. 2 is a simplified equivalent circuit of neighborhood of the microwave device 13 of FIG. 1; Zg is impedance of power source connected to the input terminal 2, Z1 is impedance of the FET 5 including the ¼ wavelength stub 6, and the capacitor 11 is shown as a series circuit of a capacitor and a resistance.

Further, the length of the gold wire 12 connecting the capacitor 11 and the high impedance line 10 is selected to be sufficiently short such as equal to or less than about ⅛ compared with the wavelength, so that the impedance caused by the gold wire 12 is small enough to be ignored and is omitted here.

Here, the impedance Zg of the power source and the characteristic impedance of the main line 3 are selected to be 50Ω, so that the impedance Z1 looking the power source side from the connecting part of the main line 3 with the high impedance line 9 is 50Ω. Further, by selecting, for example, ¼ wavelength in the desired frequency band for the length of the high impedance line 9 and 70.7Ω for the characteristic impedance, the impedance Z2 looking the power source side from the connecting point of the high impedance line 9 with the capacitor 11 is 100Ω.

However, the impedance looking the load side from the connecting point of the main line 3 with the high impedance line 9, namely, the impedance at the inputting terminal of the microwave device 13 is 50Ω.

Similarly, when the load impedance Z1 and the characteristic impedance of the main line 4 is 50Ω, and the length of the high impedance line 10 and the characteristic impedance are ¼ wavelength and 70.7Ω, respectively, the impedance looking the load side from the connecting point of the capacitor 11 with the high impedance line 10; the impedance at the outputting terminal of the microwave device 13 is 50Ω.

Like the microwave device 13 according to the embodiment of the present invention, by structuring to load the capacitor 11 between the high impedance lines 9 and 10 having ¼ wavelength, it is possible to increase the impedance of the place where the capacitor 11 is loaded and further to make the impedance 50Ω at the inputting/outputting terminal of the microwave device 13.

Like this, it is clearly understood from the expression (1) that the impedance Z of the part where the capacitor 11 is loaded can be increased and the loss can be reduced even if the resistance of the capacitor 11 is the same as the conventional one.

FIG. 3 shows an example of the loss characteristics of the microwave device 13 according to the embodiment of the present invention. A solid line shows the characteristics of the microwave device according to the embodiment of the present invention, and a broken line shows the characteristics of the conventional microwave device, which is shown for comparison. Compared with a device which loads the capacitor on the main line of which the characteristic impedance is 50Ω like the conventional microwave device, the microwave device 13 according to the embodiment of the present invention can reduce the loss in the desired frequency band.

For example, if the resistance of the capacitor 11 is 1Ω, the loss of the conventional device is 0.086 dB, and on the other hand, the embodiment of the present invention can reduce the loss to ½, which is 0.043 dB, by selecting 70.7Ω for the characteristic impedance of the high impedance lines 9 and 10. Further, by increasing the characteristic impedance of the high impedance lines 9 and 10 more, it is possible to further reduce the loss.

As discussed above, the microwave device according to the embodiment of the present invention can reduce the loss compared with the conventional device even if the capacitor 11 of which the resistance component is the same. Therefore, it is possible to obtain low noise characteristics by applying the microwave device to the low-noise amplifier, and further to achieve higher output and make the device highly efficient by applying to the high-output amplifier.

In particular, when applied to a high-output amplifier of 100 W class, it is possible to largely reduce the calorific power of the capacitor and further have an effect to improve the reliability of the microwave device. Here, since the impedance of the input/output terminal of the microwave device 13 is 50Ω, even if this device is directly loaded on the main line of the microwave component, the characteristics of the microwave component is not degraded.

FIG. 4 is a structure diagram showing another embodiment of the microwave device according to the first embodiment; (a) in FIG. 4 shows the case in which a chip-formed capacitor 11 having electrodes at both ends is used for the capacitor 11.

By using this kind of the capacitor 11, the gold wire 12 connecting the capacitor 11 and the high impedance line 10 shown in FIG. 1 becomes unnecessary, which has the effect to facilitate the manufacturing.

Further, (b) in FIG. 4 shows the case in which a gap capacitor is used for the capacitor 11; since this capacitor can be formed as one body with the main lines 3 and 4 and the high impedance lines 9 and 10 on the dielectric board I by using the microwave integrated circuit technique, and in particular it is unnecessary to use the chip-formed capacitor, the manufacturing is further facilitated.

Further, (c) in FIG. 4 shows the case in which a board which is different from the one forming the main lines 3 and 4 is used for the dielectric board 14 forming the microwave device 13.

By using a board having a good thermal conductivity such as aluminum nitride, etc. for the dielectric board 14, it is possible to discharge heat generated by the capacitor 11, which has the effect to improve further the reliability of the microwave device 13. Here, the microwave device of this structure has the same function and effect of the microwave device that have been explained in FIGS. 1 through 3.

Embodiment 2

FIG. 5 shows a structure of the microwave device according to the second embodiment and its equivalent circuit. 15 and 16 are transmission lines whose lengths are sufficiently short such as equal to or less than about ⅛ compared with the wavelength in the desired frequency band and whose characteristic impedance is higher than 50Ω, and 17 and 18 are open-circuited stubs whose lengths are shorter than ¼ wavelength in the desired frequency band.

This microwave device is, as shown in (a) in FIG. 5, includes two transmission lines 15 and 16, two open-circuited stubs 17 and 18, the capacitor 11, and the gold wire 12. To the top of the transmission line 15, the open-circuited stubs 17 and 18 are connected, the chip-formed capacitor 11 is loaded on neighborhood of the connecting point of the open-circuited stubs 17 and 18, and the capacitor 11 and the transmission line 16 are connected by the gold wire 12. The microwave device 13 of this structure is loaded between the main lines 3 and 4 as shown in the first embodiment.

(b) in FIG. 5 shows a simplified equivalent circuit of (a) in FIG. 5. Since the transmission lines 15 and 16 have high impedance and the lengths are sufficiently short such as equal to or less than about ⅛ compared with the wavelength, the transmission lines 15 and 16 are shown as inductors, and further, the open-circuited stubs 17 and 18 which are shorter than ¼ wavelength can be shown as capacitors equivalently.

Further, the capacitor 11 is shown as a series circuit of a resistance and a capacitor, and a value of the capacitor 11 is selected to be a value which suppresses the impedance sufficiently small such as equal to or less than some Ω (equal to or less than 4Ω to 5Ω, for example) in the desired frequency band. Moreover, the length of the gold wire 12 connecting the capacitor 11 and the transmission line 16 is selected to be sufficiently short such as equal to or less than about ⅛ compared with the wavelength, and the inductor caused by the gold wire 12 is so small to be ignored, so that it is omitted here.

As shown in FIG. 5, in the microwave device, the capacitor 11 is loaded between an L-shape circuit formed by the transmission line 15 and the open-circuited stub 17 and another L-shape circuit formed by the transmission lines 16 and the open-circuited stub 18. It is generally known that this kind of L-shape circuit includes impedance conversion function.

For example, in order to convert 50Ω to 100Ω in 2 GHz, the inductor is about 4 nH, and the capacitor is about 0.8 pF. By selecting the lengths and the characteristic impedance of the transmission lines 15 and 16, and the lengths and the characteristic impedance of the open-circuited stubs 17 and 18 so as to obtain such values as the above, it is possible to make the impedance of the input/output terminal of the microwave device 50Ω, while maintaining the impedance at the place where the capacitor 11 is loaded to 100Ω.

Like this, the impedance at the place where the capacitor 11 is loaded can be increased, and it is possible to reduce the loss of the microwave device as explained in the first embodiment. This microwave device has an effect to reduce the degradation of the noise figure in, for example, the low-noise amplifier, and the decrease of the output efficiency in the high-output amplifier. Further, in the high-output amplifier of 100W class, the heat generation can be reduced in the capacitor 11 that forms the microwave device, which has the effect to improve the reliability of the microwave device.

Here, since the high impedance lines 9 and 10 having ¼ wavelength as shown in the first embodiment are unnecessary, another effect is obtained that the device according to the present embodiment can be smaller compared with the first embodiment.

FIG. 6 shows a structure of another embodiment using the microwave device according to the second embodiment. 19 is a dielectric block, 20 is a metal pattern, and 21 is a through hole.

Although having the same basic structure as the one shown in FIG. 5, this microwave device is formed on the dielectric board 1, and the dielectric block 19 that has good thermal conductivity such as aluminum nitride, etc. is provided between the metal pattern 20 on which the through hole 21 is made and the top of the open-circuited stub 17.

By providing the dielectric block 19 at the top of the open-circuited stub 17, the value of the capacitor caused by the open-circuited stub 17 is slightly changed. The length and the characteristic impedance of the open-circuited stub 17 are selected so as to obtain the desired value, with consideration of providing the dielectric block 19.

By the above structure, it is possible to discharge heat generated at the capacitor 11 through the open-circuited stub 17, the dielectric block 19, and the through hole 21. This enables to reduce the temperature of the capacitor 11, which has an effect to obtain higher reliability than the microwave device of FIG. 5.

As has been discussed, the microwave device shown in the first and second embodiments has a function to supply the desired DC bias voltage and the microwave signals to the semiconductor element used for the microwave component, and further, the microwave device of the embodiments can improve performance and reliability of the microwave component, since the loss is small.

Embodiment 3

In the following, the third embodiment related to the present invention will be explained with reference to the figures.

FIG. 7 shows a structure of a high-frequency device of microwave or millimeterwave band. FIG. 7 shows a structure example when the high-frequency device is applied to the input side of the amplifier that forms the high-frequency equipment such as the microwave equipment or the millimeterwave equipment, etc. In the following explanation, the microwave device 13 will be explained as an example of the high-frequency device.

In FIG. 7, this amplifier includes the main lines 3 and 4, the microwave device 13 provided between the main lines 3 and 4, a ¼ wavelength stub 40 whose one end is connected to the main line 4, the input terminal 2 connected to one end of the main line 3, the FET 5 connected to one end of the main line 4, the capacitor 11 for connecting the top of the ¼ wavelength stub 40 to ground by high frequency, and the gold wire 12. The main lines 3 and 4, the microwave device 13, and the ¼ wavelength stub 40 are formed as one body on the dielectric board 1 by using the microwave integrated circuit technique. Metal film for grounding is coated on the back face of the dielectric board 1. Around the capacitor 11, bias power source 50 for applying DC bias voltage is connected to the top of the ¼ wavelength stub 40. Further, power source to generate microwave signals is connected to the input terminal 2; however, the description is omitted here.

The microwave device 13 is structured to include one ends of the main lines 3 and 4, the high impedance lines 9 and 10, and two capacitors 7. The high impedance lines 9 and 10 are provided from one ends of the main lines 3 and 4, which are arranged so that one ends are contacted each other, to direct towards the side of the respective facing main lines 3 and 4 and include characteristic impedance being higher than 50Ω. Two capacitors 7 are respectively provided on the upper surface of one ends of the side, to which the high impedance lines 9 and 10 are connected, of the main lines 3 and 4. The top (one end) of the high impedance line 9 and the capacitor 7 loaded on one end of the main line 3 are connected with the gold wire 8. Further, the top (one end) of the high impedance line 10 and the other capacitor 7 loaded on one end of the main line 4 are connected with the gold wire 8. The value of the capacitor 7 is set to a value of which impedance is sufficiently small such as equal to or less than some Ω, (equal to or less than 4Ω to 5Ω, for example) in the desired frequency band, and the length of the gold wire 12 is selected to be sufficiently short such as equal to or less than about ⅛ compared with the wavelength.

It is needless to say that another kind of conductive line such as gold ribbon can be used instead of the gold wire 8. Further, as shown in FIG. 7, although it is preferable that one end of the main line 3 and the other end of the high impedance line 10 are connected without seam by forming as one body, and one end of the main line 4 and the other end of the high impedance line 9 are connected without seam by forming as one body, the connection mode is not limited to this. For example, it is also possible that one end of the main line 3 is connected to the other end of the high impedance line 10 with the gold wire, and one end of the main line 4 is connected to the other end of the high impedance line 9 with the gold wire.

Like this, in the microwave device 13 according to the third embodiment, by loading the capacitor 7 dispersedly on the main lines 3 and 4, the capacitor 7 can be loaded without broadening the line width of the main lines 3 and 4.

Here, if two capacitors 7 are loaded in parallel on the same main line, the line width needs to be wide enough to load two capacitors 7, so that the line width of the main line 3 or the main line 4 should be broadened. In such a case, the characteristic impedance of a part of the main line 3 or 4 becomes different from the other part, which is not preferable.

By applying the microwave device 13 according to the third embodiment to the input side of the amplifier, the DC bias voltage applied from neighborhood of the capacitor 11 is blocked by the capacitor 7 and is not supplied to the power source connected to the input terminal 2. This enables to supply the DC bias voltage only to the gate terminal of the FET 5 through the ¼ wavelength stub 40. On the other hand, since the impedance of the ¼ wavelength stub 40 which is short-circuited by high frequency by the capacitor 11 and the gold wire 12 becomes very high in the desired frequency band, the microwave signals generated by the power source are inputted to the gate terminal of the FET 5 through the input terminal 2, the main line 3, the microwave device 13, and the main line 4.

Like this, by applying the microwave device 13 according to the third embodiment to the microwave equipment such as the amplifier, etc., the desired DC bias voltage and the microwave signals can be supplied to the semiconductor elements such as the FET 5, etc. In this case, the capacitor 11 and the ¼ wavelength stub 40 form a bias circuit.

FIG. 8 is a simplified equivalent circuit of neighborhood of the microwave device 13 shown in FIG. 7. In the figure, Zg is the impedance of the power source connected to the input terminal 2, and Z1 is the load impedance of the FET 5 including the ¼ wavelength stub 40.

According to the microwave device of the third embodiment, by structuring as shown in FIG. 7, the microwave device can be shown as an equivalent circuit in which a series circuit including the high impedance line 9 and the capacitor 7 and a series circuit including the high impedance line 10 and the capacitor 7 are connected in parallel. Further, the capacitor 7 which has a loss is shown as a series circuit including a capacitor and a resistance. The microwave device like this is loaded between the main lines 3 and 4.

Here, the length of the gold wire 8 which connects between the capacitor 7 and the main lines 3 and 4 is selected to be sufficiently short such as equal to or less than about ⅛ compared with the wavelength, so that the inductor caused by the gold wire 8 is small enough to be ignored, and which is omitted here.

Here, the impedance Zg of the power source and the characteristic impedance of the main line 3 are selected to be 50Ω, and the impedance looking the power source side from the connecting part of the main line 3 with the microwave device 13 is 50Ω. Further, if the characteristic impedance of the high impedance lines 9 and 10 is selected to be, for example, 100Ω, the value of the capacitor 7 is selected to be sufficiently small such as equal to or less than some Ω (equal to or less than 4Ω to 5Ω, for example) in the desired frequency band, and further the resistance is small such as about 1Ω, the microwave device can be approximately deemed as a structure in which the high impedance lines 9 and 10 whose characteristic impedance is 100Ω are connected in parallel. In such a case, regardless of the length of the high impedance lines 9 and 10, it is possible to obtain the impedance of about 50Ω at the input/output end of the microwave device 13 over wide band.

Similarly, if the impedance Z1 of the load and the characteristic impedance of the main line 4 are 50Ω, the impedance looking the load side from the connecting part of the main line 4 with the microwave device 13 is 50Ω. Thus, this microwave device can be deemed to be loaded between the main lines 3 and 4 of which the impedance is 50Ω.

Accordingly, the microwave device 13 of the third embodiment has a structure in which the series circuit including the capacitor 7 and the high impedance line 9 and the series circuit including the capacitor 7 and the high impedance line 10 are connected in parallel. Because of this, the resistance parasitizing the capacitor 7 can be also deemed to be connected in parallel. Therefore, although the resistance of the capacitor 7 is the same as the conventional one, the composed resistance becomes about a half, so that it is possible to reduce the loss as clearly understood from the expression (1).

FIG. 9 is an example showing characteristics of insertion loss of the microwave device 13 according to the third embodiment.

In the figure, a solid line shows the characteristics of the microwave device of the embodiment of the present invention, and a broken line shows the characteristics of the conventional microwave device, which is shown for comparison.

Compared with the conventional microwave device which loads the capacitor on the main line having the characteristic impedance of 50Ω, the microwave device 13 according to the third embodiment can reduce the composed resistance parasitized on the capacitor 7 to about a half Because of this, it is possible to achieve the loss reduction over wide band.

For example, if the resistance of the capacitor 7 is 1Ω, the insertion loss becomes 0.086 dB in the conventional one. On the contrary, in the third embodiment, by selecting the characteristic impedance of the high impedance lines 9 and 10 to 100Ω, the insertion loss becomes 0.043 dB, that is, the loss can be reduced to ½ compared with the conventional one.

Further, even if the characteristic impedance of the high impedance lines 9 and 10 are not 100Ω, by selecting the length of the high impedance lines 9 and 10 to be sufficiently short such as equal to or less than about ⅛, it is possible to reduce the degradation of the impedance at the input/output end of the microwave device from 50Ω. Therefore, it is possible to obtain good reflection characteristics and also reduce the loss.

As discussed above, according to the microwave device of the third embodiment, by structuring to load two capacitors 7 equivalently in parallel, it is possible to reduce the loss compared with the conventional one. Because of this, by applying this microwave device to a low-noise amplifier, the low-noise characteristics can be obtained, and further, by applying to a high-output amplifier, it is possible to achieve a higher output and higher efficiency.

Further, when the microwave device of the third embodiment is applied to a high-output amplifier of 100 W class, it is possible to reduce the composed resistance paratisized on the capacitor 7 to about a half, so that the calorific power of the capacitor 7 can be largely decreased. In addition, by inserting the high impedance lines 9 and 10 between two capacitors 7, the two capacitors are arranged spaced from each other, and thus the heated portion by the capacitor 7 can be dispersed. That is, the increase of the temperature in the capacitor 7 can be largely suppressed, which also has the effect to increase the operation reliability of the microwave device.

In particular, a wideband gap device of GaN system has been developed as a high-output semiconductor element, and a high-output amplifier of 100 W or more is now being embodied. When the wideband gap device is used for the FET, the calorific power of the capacitor of the conventional structure becomes about 2 W, which means the temperature around the capacitor becomes thermally serious condition, so that the reliability of the microwave device is largely decreased. However, by connecting the microwave device 13 according to the third embodiment to the FET 5 of GaN system, it is possible to largely suppress the increase of the temperature in the capacitor 7. This enables to obtain a high-output microwave device which has a high operation reliability for ambient temperature.

Here, since the impedance at the input/output terminal of the microwave device 13 is 50Ω, even if this device is loaded directly on the main line of the microwave component, the characteristics of the microwave component would not be degraded.

FIG. 10 shows structures of other modes of the microwave device according to the third embodiment. (a) in FIG. 10 shows an other mode 1, (b) in FIG. 10 shows an other mode 2, and (c) in FIG. 10 shows an other mode 3.

Here, the other mode 1 of (a) in FIG. 10 shows a case in which a chip-formed capacitor 7 having electrodes at both ends is used for the capacitor 7. In this example, one end (the top) of the high impedance line 9 is connected to the electrode of one end of the capacitor 7, and one end of the main line 3 is connected to the electrode of the other end of the capacitor 7. Further, one end (the top) of the high impedance line 10 is connected to the electrode of one end of the capacitor 7, and one end of the main line 3 is connected to the electrode of the other end of the capacitor 7.

By using the capacitor 7 like this, the gold wires 8 for respectively connecting between the capacitor 7 and the high impedance line 9 and between the capacitor 7 and the high impedance line 10 shown in FIG. 7 becomes unnecessary, which has the advantage to facilitate the manufacturing.

Further, the other mode 2 of (b) in FIG. 10 shows a case in which a gap capacitor is used for the capacitor 7. By employing the microwave integrated circuit technique, this capacitor 7 can be formed on the dielectric board 1 as a one body with the main lines 3 and 4 and the high impedance lines 9 and 10. In this example, in particular, it is unnecessary to use the chip-formed capacitor, so that the manufacturing is further facilitated, which is the advantage.

Further, the other mode 3 of (c) in FIG. 10 shows a case in which a board being different from the one which forms the main lines 3 and 4 is used for the dielectric board 14 which forms the microwave device 13. By using a board having excellent thermal conductivity such as aluminum nitride for the dielectric board 14, it is possible to efficiently discharge the heat generated by the capacitor 7, so that the reliability of the microwave device 13 is further improved, which is the advantage.

Here, although the main line 3 is formed over the dielectric board 1 and the dielectric board 14, the main lines 3 between the both boards can be connected by the gold wire, or a conductive layer of the main line 3 can be formed as a one body by stacking the both boards and connected. The main lines 4 are also connected between the dielectric board 1 and the dielectric board 14 similarly to the main lines 3.

Here, the microwave device structured by the other modes shown in (a) through (c) in FIG. 10 have the same function and effect as the microwave device as has been explained in FIGS. 7 through 9.

Next, FIG. 11 is a structure showing yet another mode of the microwave device according to the third embodiment; (a) in FIG. 11 shows an other mode 4 and (b) in FIG. 11 shows an other mode 5.

In (a) in FIG. 11, one high impedance line 10 is connected to one end of the main line 3, and two high impedance lines 9 are connected to one end of the main line 4, and between the capacitor 7 loaded on the main line 3 and the tops of the two high impedance lines 9 and between the capacitor 7 loaded on the main line 4 and the tops of the two high impedance lines 10 are respectively connected by the gold wires 8.

Further, in (b) in FIG. 11, two high impedance lines 10 and 9 are connected to one ends of the main lines 3 and 4, and between the capacitor 7 loaded on the main line 3 and the tops of the two high impedance lines 9 and between the capacitor 7 loaded on the main line 4 and the tops of the two high impedance lines 10 are respectively connected by the gold wires 8.

As discussed above, the device in which plural high impedance lines 9 and 10 are connected to one ends of the main lines 3 and 4 has the same function and the same effect.

Embodiment 4

In FIG. 12, (a) shows a structure of a high-frequency device such as a microwave or millimeterwave device, etc., and (b) shows an equivalent circuit according to the fourth embodiment of the present invention. Here, a structure example of the case, in which this high-frequency device is applied to an input side of an amplifier which forms a high-frequency device such as a microwave equipment, a millimeterwave equipment, etc., is the same as FIG. 1, so that the explanation will be limited only to the structure of the microwave device 13 here.

In this microwave device, as shown in (a) in FIG. 12, the capacitors 7 are respectively loaded on one ends of the main lines 3 and 4 which are arranged so that the one ends are contacted each other, and between the capacitor 7 loaded on the main line 3 and one end of the main line 4 and between the other capacitor 7 loaded on the main line 4 and one end of the main line 3 are respectively connected by the gold wire 8.

(b) in FIG. 12 is an equivalent circuit of (a) in FIG. 12. This microwave device is shown as the equivalent circuit in which two capacitors 7 are connected in parallel, and they are loaded between the main lines 3 and 4. Further, the capacitor 7 is shown as a series circuit including resistance and a capacitor, and the value of the capacitor 7 is selected to be a value which suppresses the impedance sufficiently small such as equal to or less than some Ω (equal to or less than 4Ω to 5Ω, for example) in the desired frequency band. Further, the length of the gold wire 8 which connects between the capacitor 7 and the main line 3 and between the capacitor 7 and the main line 4, respectively, is selected to be sufficiently short such as equal to or less than about ⅛ compared with the wavelength, and inductor caused by the gold wire 8 is small enough to be ignored and is omitted here. It is needless to say that another conductive line such as a gold ribbon can be used instead of the gold wire 8.

As shown in FIG. 12, this microwave device can be deemed as the one in which two capacitors 7 are connected in parallel, and the composed resistance paratisized on the capacitor 7 becomes a half compared with the case including one capacitor 7. Because of this, similarly to the third embodiment, it is possible to reduce the loss to ½ compared with the conventional microwave device. Further, in the structure according to the fourth embodiment, the high impedance lines 9 and 10 shown in the third embodiment become unnecessary, so that the circuit can be further downsized, which is an advantage.

Here, other effects are the same as the third embodiment.

As has been discussed, in the high-frequency device such as the microwave device or the millimeterwave device, etc. shown in the third and fourth embodiments, the semi-conductor element used for components of the high-frequency device such as the microwave device or the millimeterwave device, etc. includes the function to supply the desired DC bias voltage and the microwave signals, and further obtains an effect that the insertion loss is small. Therefore, the components of the high-frequency device can have high performance and high reliability, which is the advantage.

EXPLANATION OF SIGNS

Figure 1:
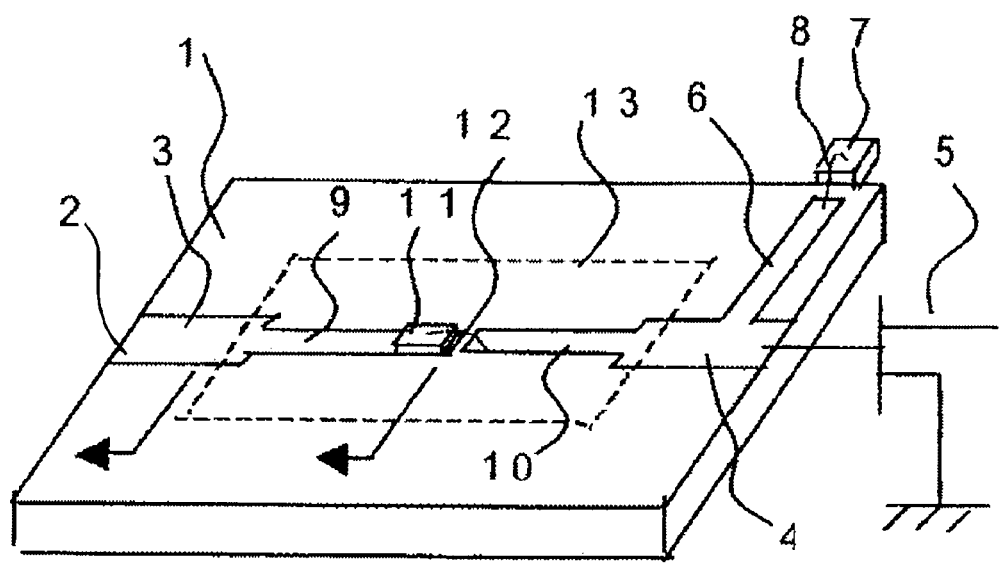
FIG. 1 shows a structure when a microwave device according to the first embodiment is applied to an input side of an amplifier.
Figure 2:
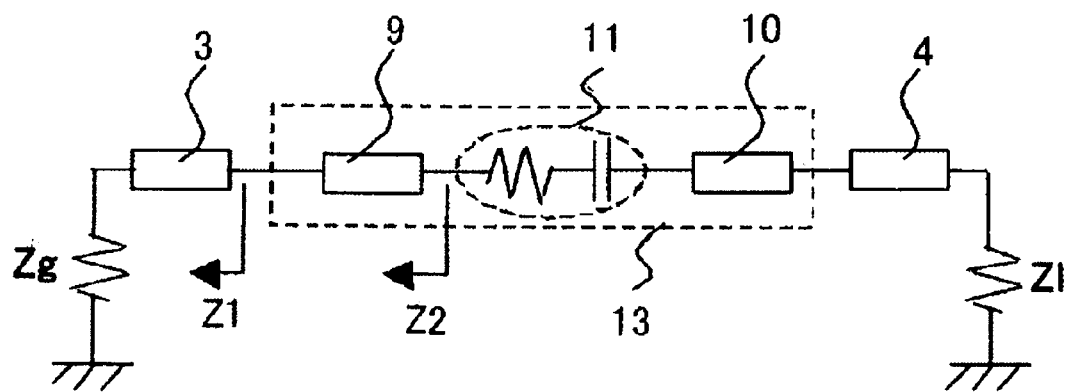
FIG. 2 shows an equivalent circuit of the microwave device according to the first embodiment.
Figure 3:
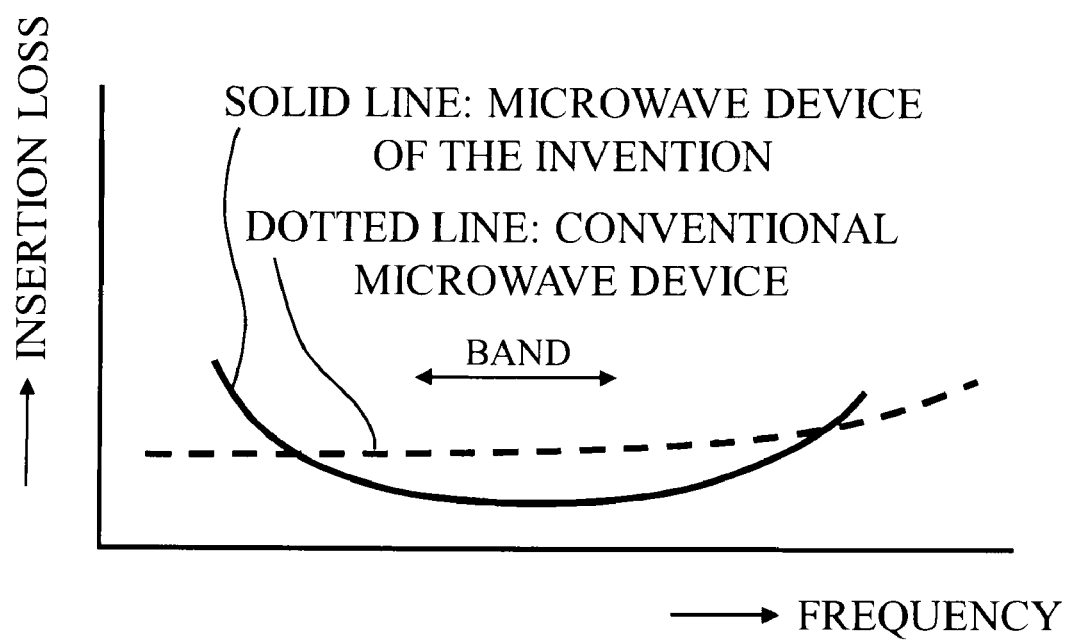
FIG. 3 shows loss characteristics of the microwave device according to the first embodiment.
Figure 4:
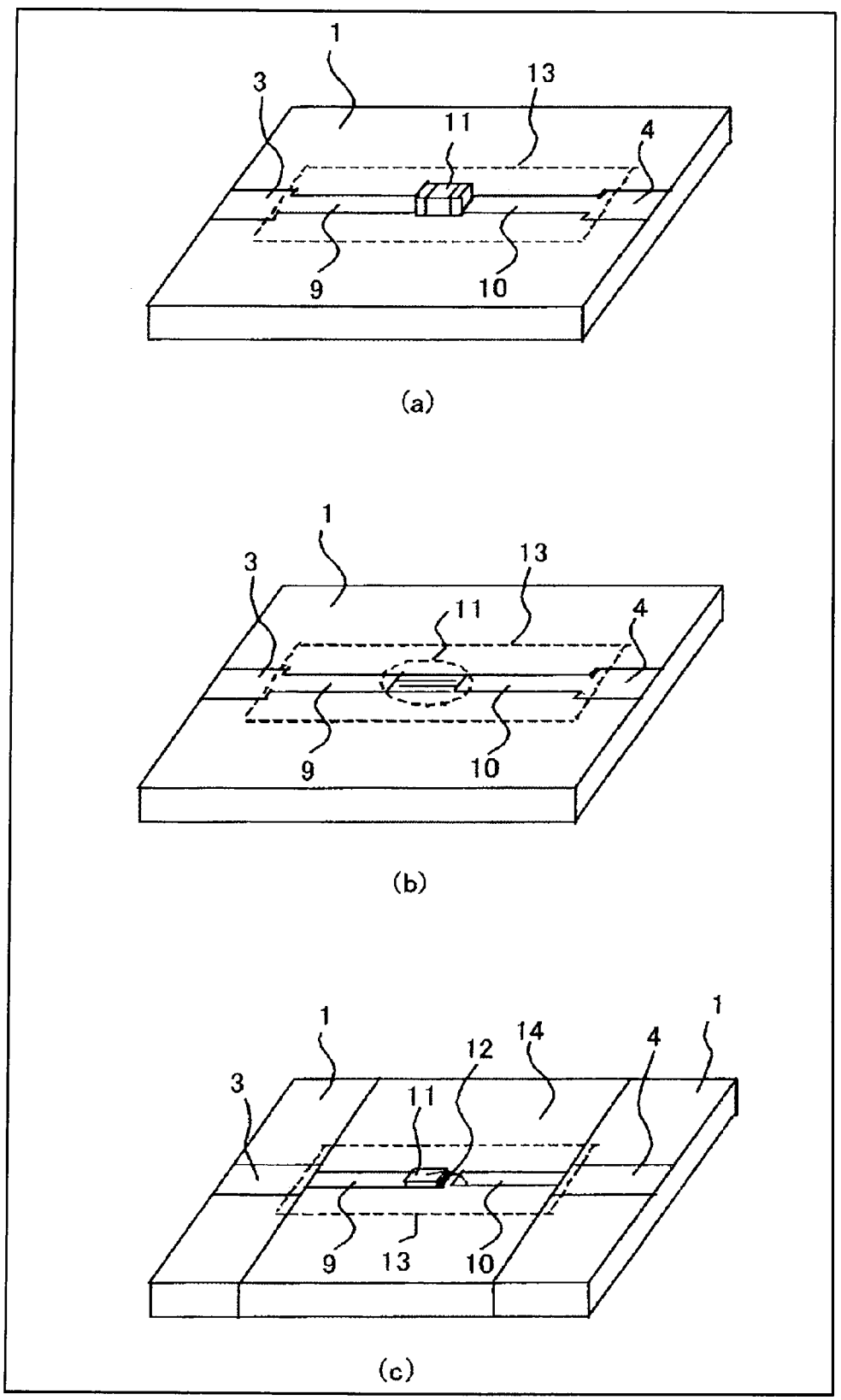
FIG. 4 shows a structure of another mode of the microwave device according to the first embodiment.
Figure 5:
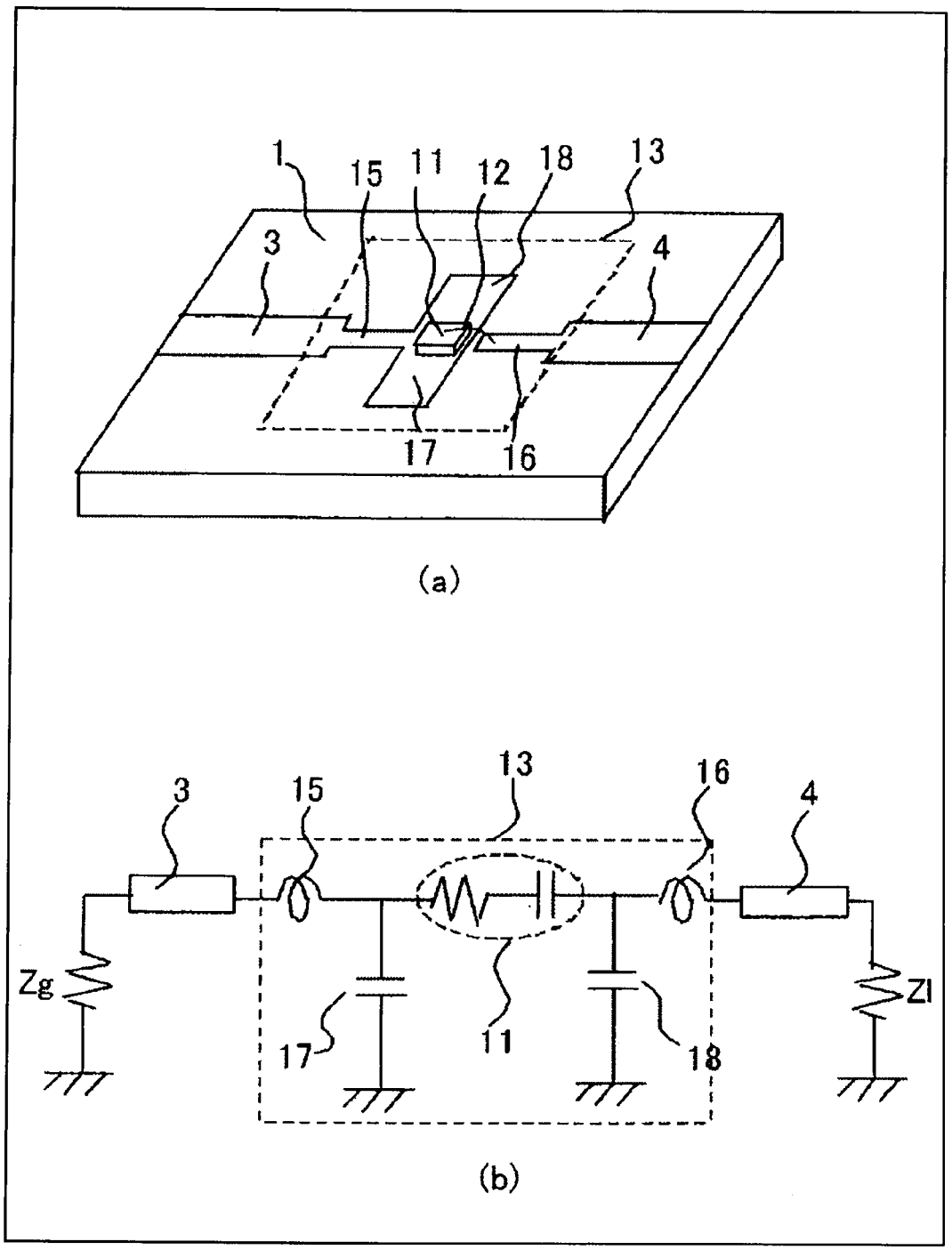
FIG. 5 shows a structure and an equivalent circuit of a microwave device according to the second embodiment.
Figure 6:
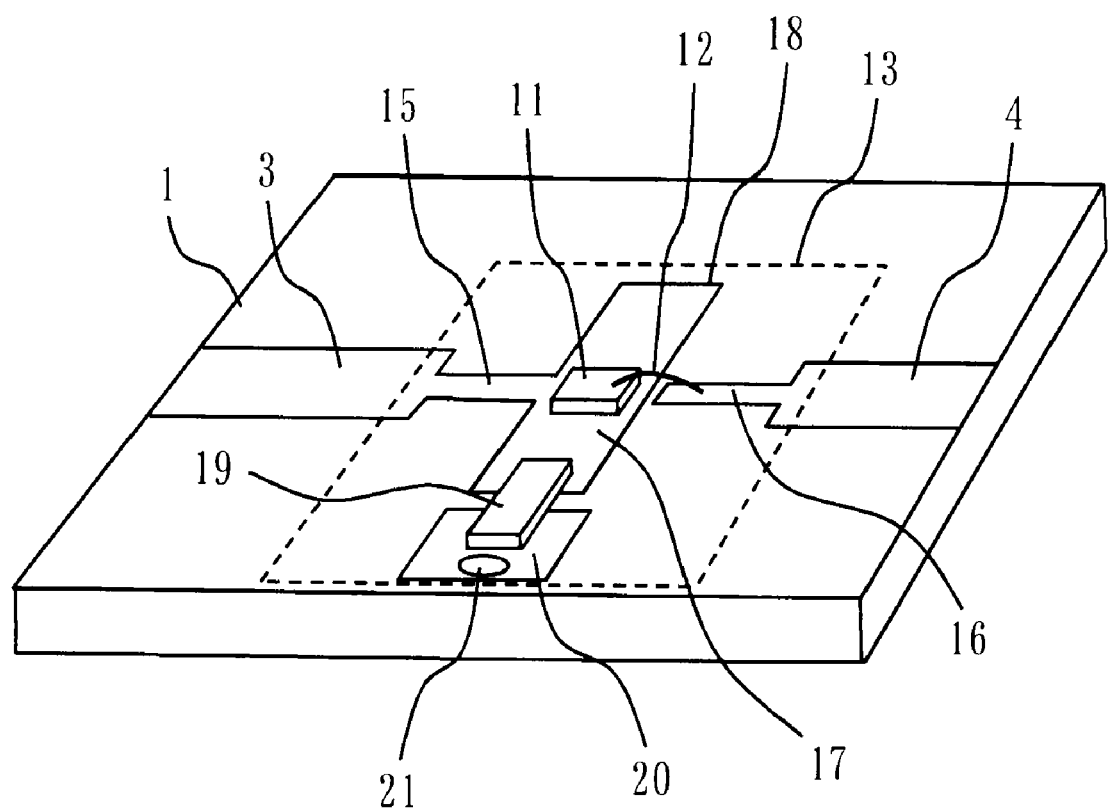
FIG. 6 shows a structure of another mode of the microwave device according to the second embodiment.
Figure 7:
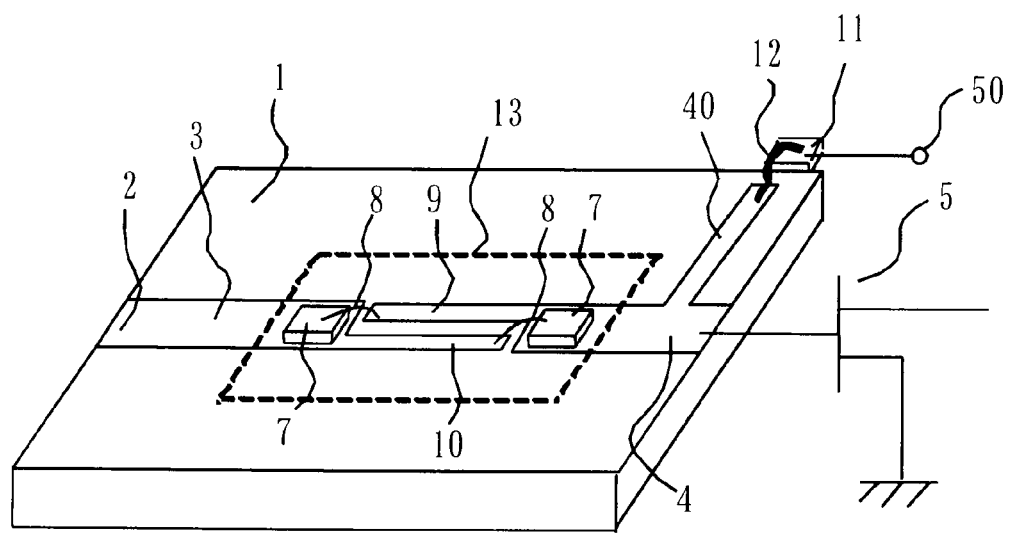
FIG. 7 shows a structure when a high-frequency device according to the third embodiment is applied to an input side of an amplifier.
Figure 8:
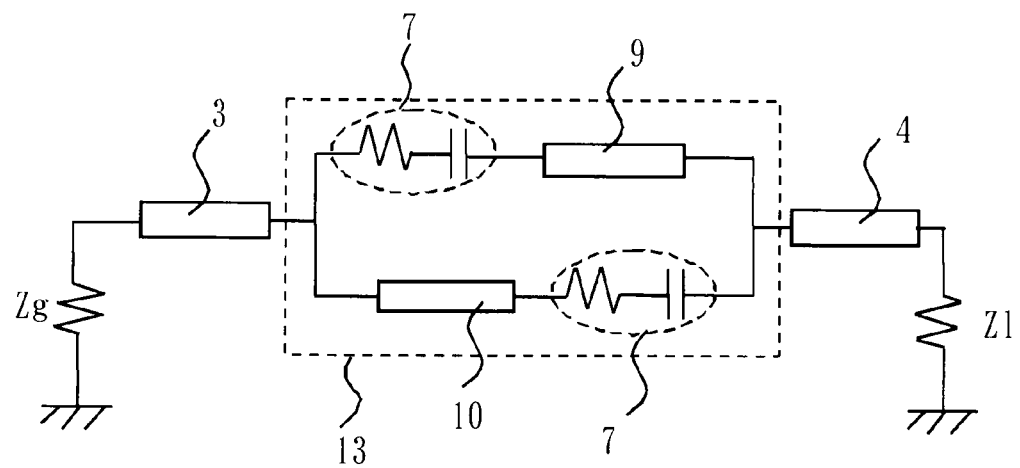
FIG. 8 shows an equivalent circuit of the high-frequency device according to the third embodiment.
Figure 9:
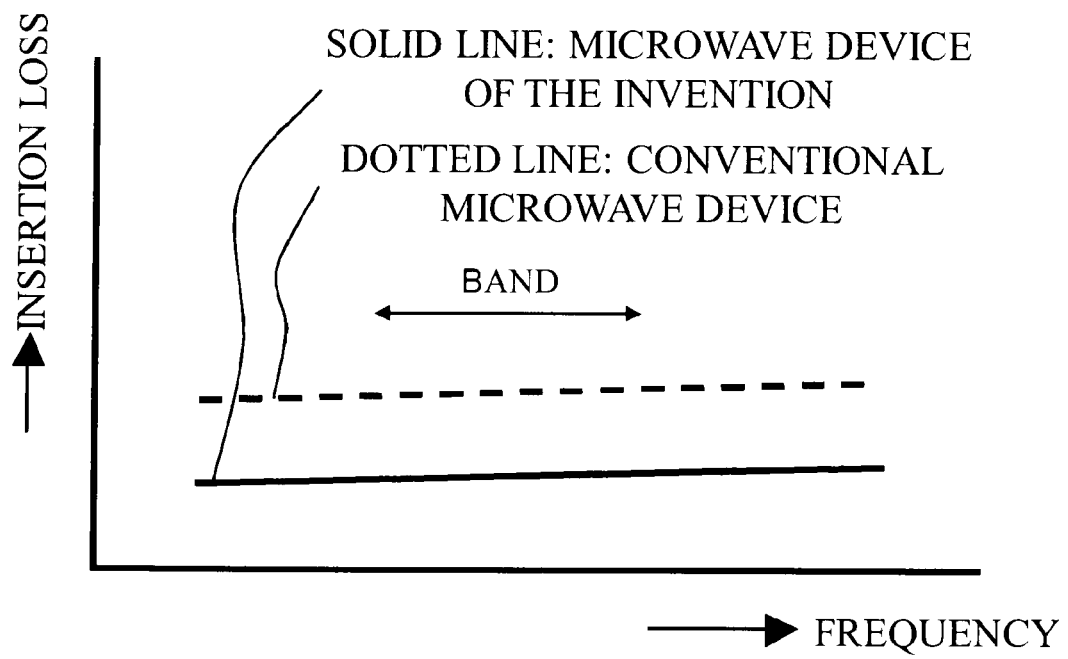
FIG. 9 shows loss characteristics of the high-frequency device according to the third embodiment.
Figure 10:
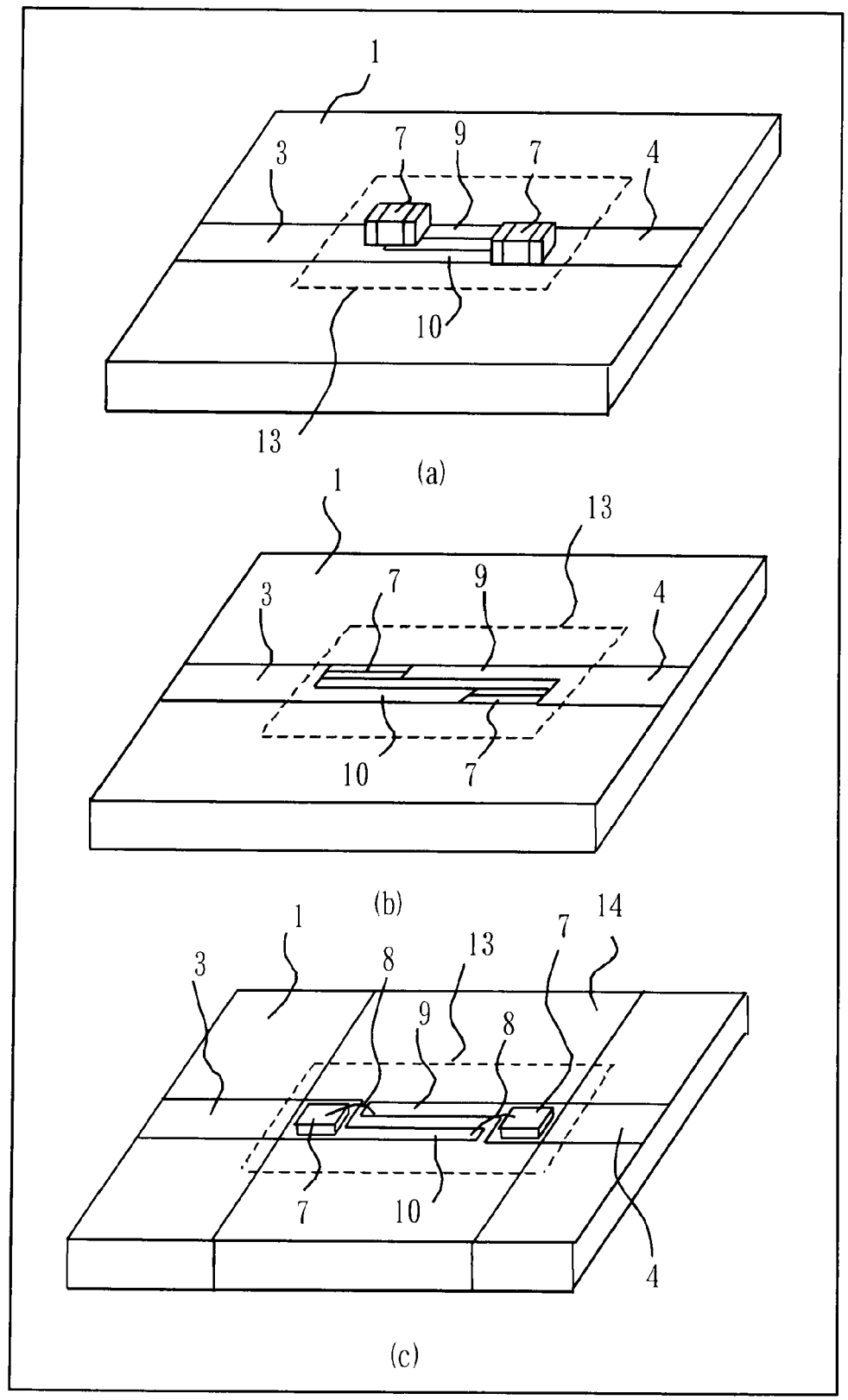
FIG. 10 shows a structure of another mode of the high-frequency device according to the third embodiment.
Figure 11:
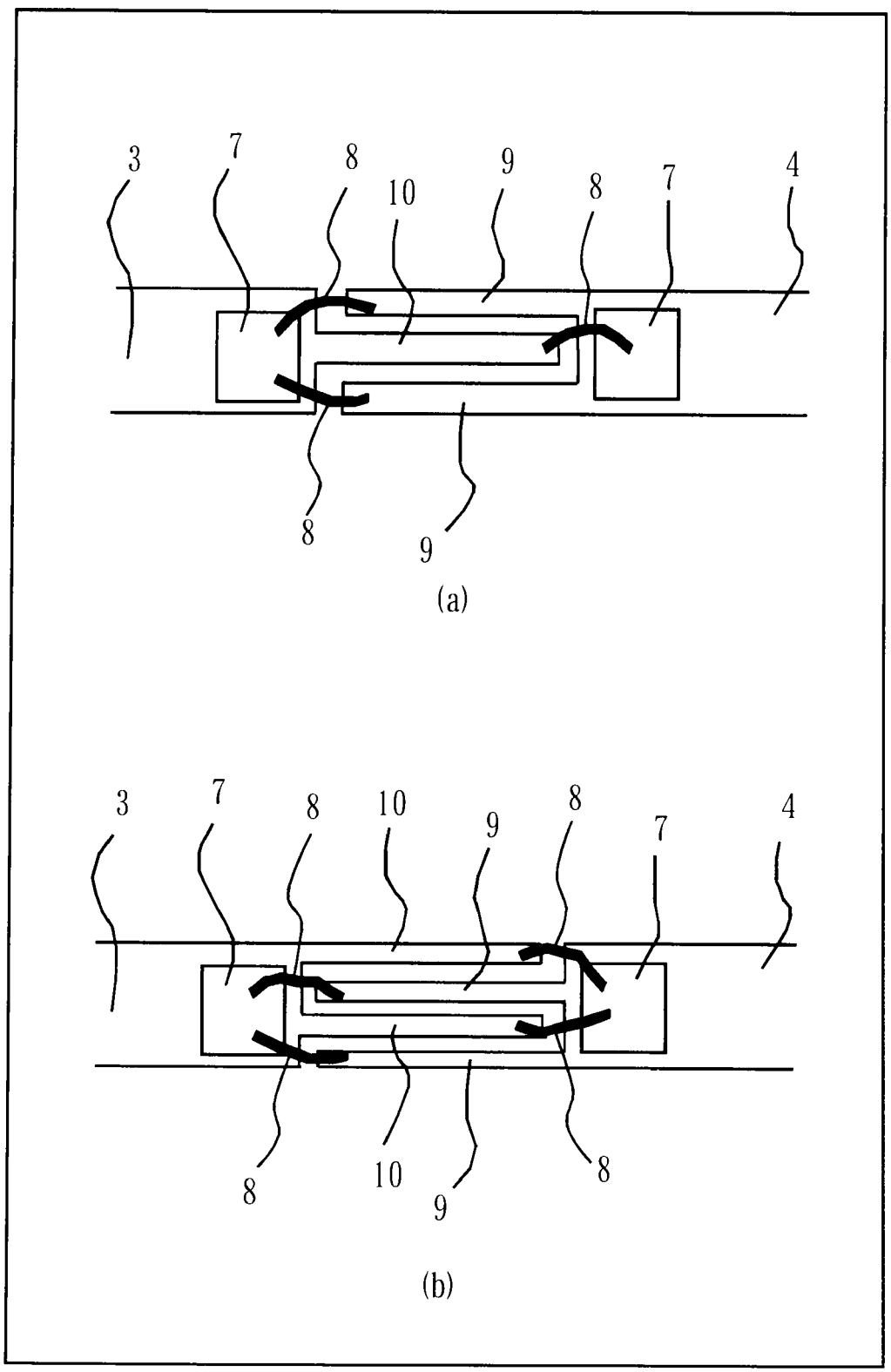
FIG. 11 shows a structure of yet another mode of the high-frequency device according to the third embodiment.
Figure 12:
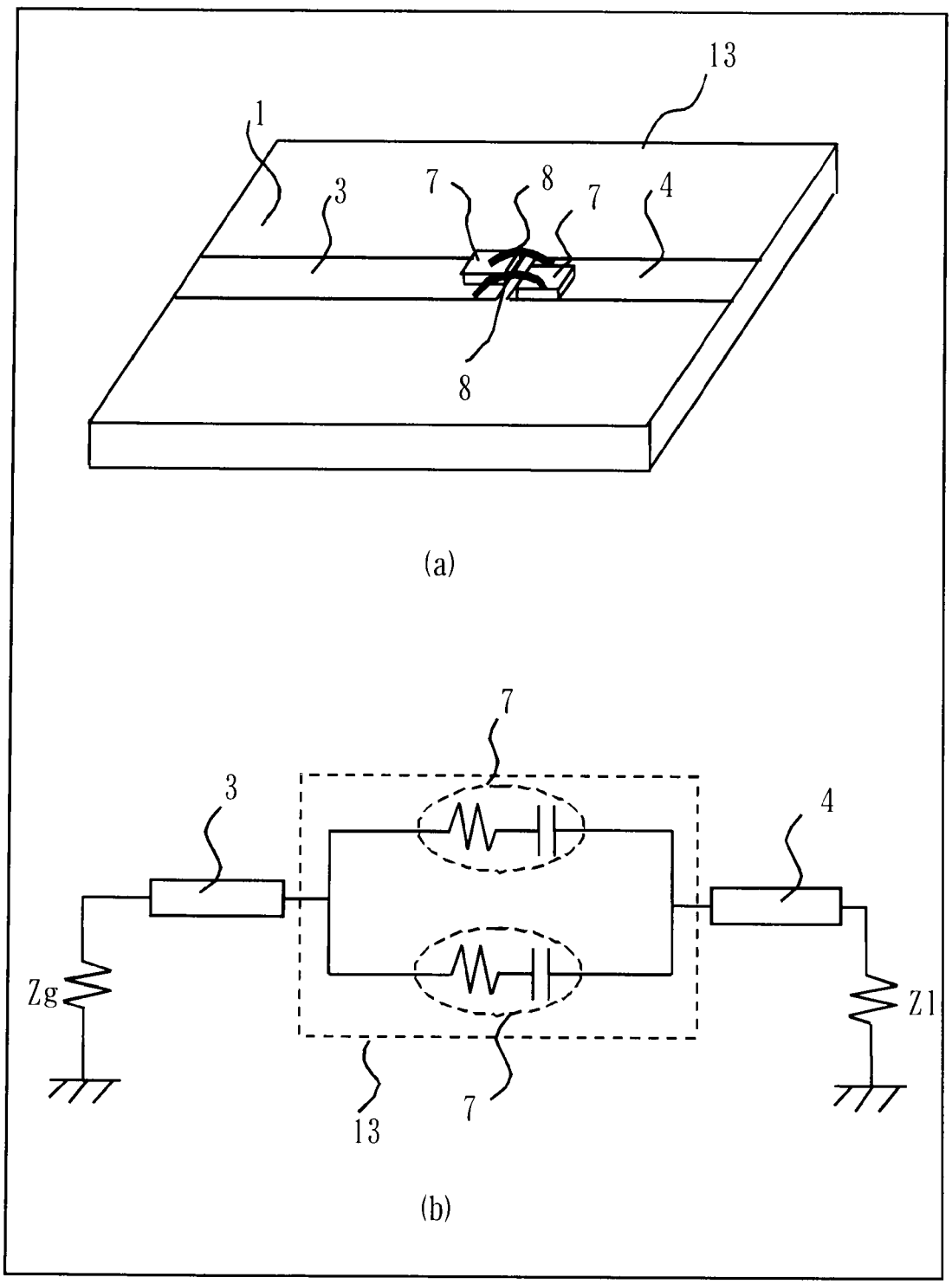
FIG. 12 shows an equivalent circuit of a high-frequency device according to the fourth embodiment.

1: a dielectric board; 2: an input terminal; 3: a main line; 4: a main line; 5: an FET; 6: a ¼ wavelength stub; 7: a capacitor; 8: a gold wire; 9: a high impedance line; 10: a high impedance line; 11: a capacitor; 12: a gold wire; 13: a microwave device; 14: a dielectric board; 15: a transmission line; 16: a transmission line; 17: an open-circuited stub; 18: an open-circuited stub; 29: a dielectric block; 20: a metal pattern; 21: a through hole; 40: a ¼ wavelength stub; and 50: bias power source.

The invention claimed is:

1. A microwave device comprising:
   two high impedance lines having a length of a ¼ wavelength in a desired frequency band and having a characteristic impedance higher than 50Ω;
   an open-circuited stub having a length shorter than a ¼ wavelength in the desired frequency band and connected to the high impedance lines; and
   a capacitor loaded between the two high impedance lines,
   a semiconductor transistor element is connected to an end of at least one of the two high impedance lines.

2. A microwave device comprising:
   two L-shape circuits, each including a transmission line having a length equal to or less than about ⅛ wavelength in a desired frequency band and a characteristic impedance higher than 50 Ω, and
   an open-circuited stub having a length shorter than a ¼ wavelength in the desired frequency band and connected to one end of the transmission line; and
   a capacitor loaded between the transmission lines to which the open-circuited stubs are connected.

3. A high-frequency device comprising:
   first and second main lines having respective L-shapes;
   respective elongated sides of the L-shapes forming first and second high impedance lines facing each other;
   first and second capacitors loaded between the first and second high impedance lines and the first and second main lines such that the first capacitor connects an end of the first high impedance line to the second main line and the second capacitor connects an end of the second high impedance line to the first main line.

4. A high-frequency device comprising:
   first and second main longitudinally extending lines;
   first and second capacitors loaded respectively on different longitudinal sides of first and second main lines at respective ends of the first and second main lines; and
   first and second conductive lines connected respectively between 1) the first and second capacitors and 2) the first and second ends of the main lines such that the first capacitor connects by the first conductive line to an end of the second main line adjacent the second capacitor and the second capacitor connects by the second conductive line to an end of the first main line adjacent the first capacitor.

5. A high-frequency equipment comprising;
   the high-frequency device of claim 3 connected to a field-effect transistor comprising gallium nitride.

6. A high-frequency equipment comprising:
   the high-frequency device of claim 4 connected to a field-effect transistor comprising gallium nitride.

7. The device of claim 1, wherein the semiconductor transistor element comprises a transistor.

8. The device of claim 1, wherein the semiconductor transistor element comprises a field-effect transistor.

* * * * *